United States Patent
Di Biase et al.

(10) Patent No.: US 11,418,139 B2
(45) Date of Patent: Aug. 16, 2022

(54) SIGNAL DETECTION METHOD, CORRESPONDING CIRCUIT, DEVICE AND SYSTEM

(71) Applicant: STMicroelectronics S.r.l., Agrate Brianza (IT)

(72) Inventors: Giuseppe Di Biase, Tromello (IT); Claudio Serratoni, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 255 days.

(21) Appl. No.: 16/794,838

(22) Filed: Feb. 19, 2020

(65) Prior Publication Data
US 2020/0280274 A1 Sep. 3, 2020

(30) Foreign Application Priority Data
Feb. 28, 2019 (IT) .......................... 102019000002959

(51) Int. Cl.
*H02P 9/00* (2006.01)
*H02P 9/30* (2006.01)

(52) U.S. Cl.
CPC ................................. *H02P 9/305* (2013.01)

(58) Field of Classification Search
CPC ........ H02J 7/2434; H02J 7/14; H02J 2310/40; G01R 31/346; G01R 31/343; G01R 31/006; H02P 9/305; H02P 9/08; H02P 9/48; H02P 9/30; B60L 50/66; Y02T 10/70; Y02T 10/92
See application file for complete search history.

(56) References Cited

U.S. PATENT DOCUMENTS

| | | | |
|---|---|---|---|
| 4,275,344 A | 6/1981 | Mori et al. | |
| 4,314,193 A | 2/1982 | Mortonson | |
| 5,376,876 A * | 12/1994 | Bauser | G11C 27/024 322/28 |
| 5,448,154 A | 9/1995 | Kanke et al. | |
| 5,497,071 A | 3/1996 | Iwatani et al. | |
| 6,147,474 A * | 11/2000 | Koss | H02P 9/08 322/28 |
| 9,960,718 B2 | 5/2018 | Tisserand et al. | |

(Continued)

FOREIGN PATENT DOCUMENTS

| DE | 4321970 A1 | 1/1994 |
|---|---|---|
| DE | 19732961 A1 | 2/1999 |

(Continued)

*Primary Examiner* — Julio C. Gonzalez
(74) *Attorney, Agent, or Firm* — Slater Matsil, LLP

(57) ABSTRACT

In an embodiment a method includes: sensing a first signal indicative of magnetization of a winding in a dynamoelectric machine; applying the first signal to a window comparator having a comparator window between upper and lower thresholds and generating window exit signals indicative of the first signal exiting the comparator window of the window comparator; generating a slowed-down replica signal of the first signal; updating the comparator window of the window comparator as a function of the slowed-down replica signal; and issuing a wake-up signal towards a control device of the dynamoelectric machine as a result of one of the window exit signals indicating the first signal exiting the comparator window of the window comparator for a time duration in excess of a duration threshold.

20 Claims, 12 Drawing Sheets

(56) References Cited

U.S. PATENT DOCUMENTS

| | | |
|---|---|---|
| 2002/0024314 A1 | 2/2002 | Takahashi et al. |
| 2002/0036484 A1 | 3/2002 | Taniguchi et al. |
| 2010/0007295 A1 | 1/2010 | Fang et al. |
| 2010/0052601 A1* | 3/2010 | Pummer .................. G05F 1/70 |
| | | 318/812 |

FOREIGN PATENT DOCUMENTS

| | | |
|---|---|---|
| EP | 0577994 A1 | 1/1994 |
| EP | 1180841 A1 | 2/2002 |
| EP | 1278286 A2 | 1/2003 |

* cited by examiner

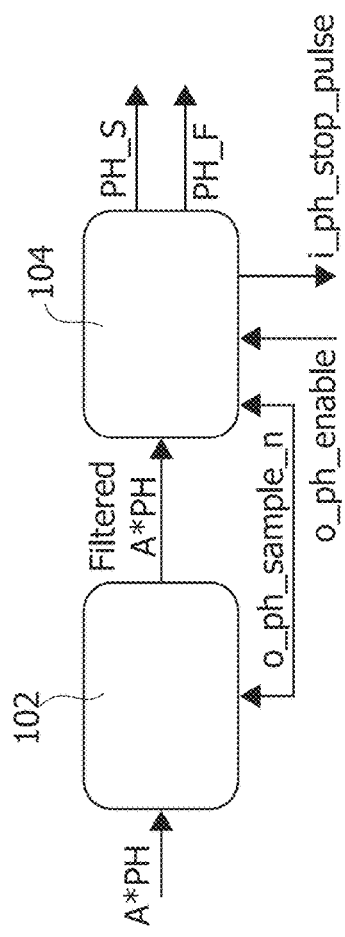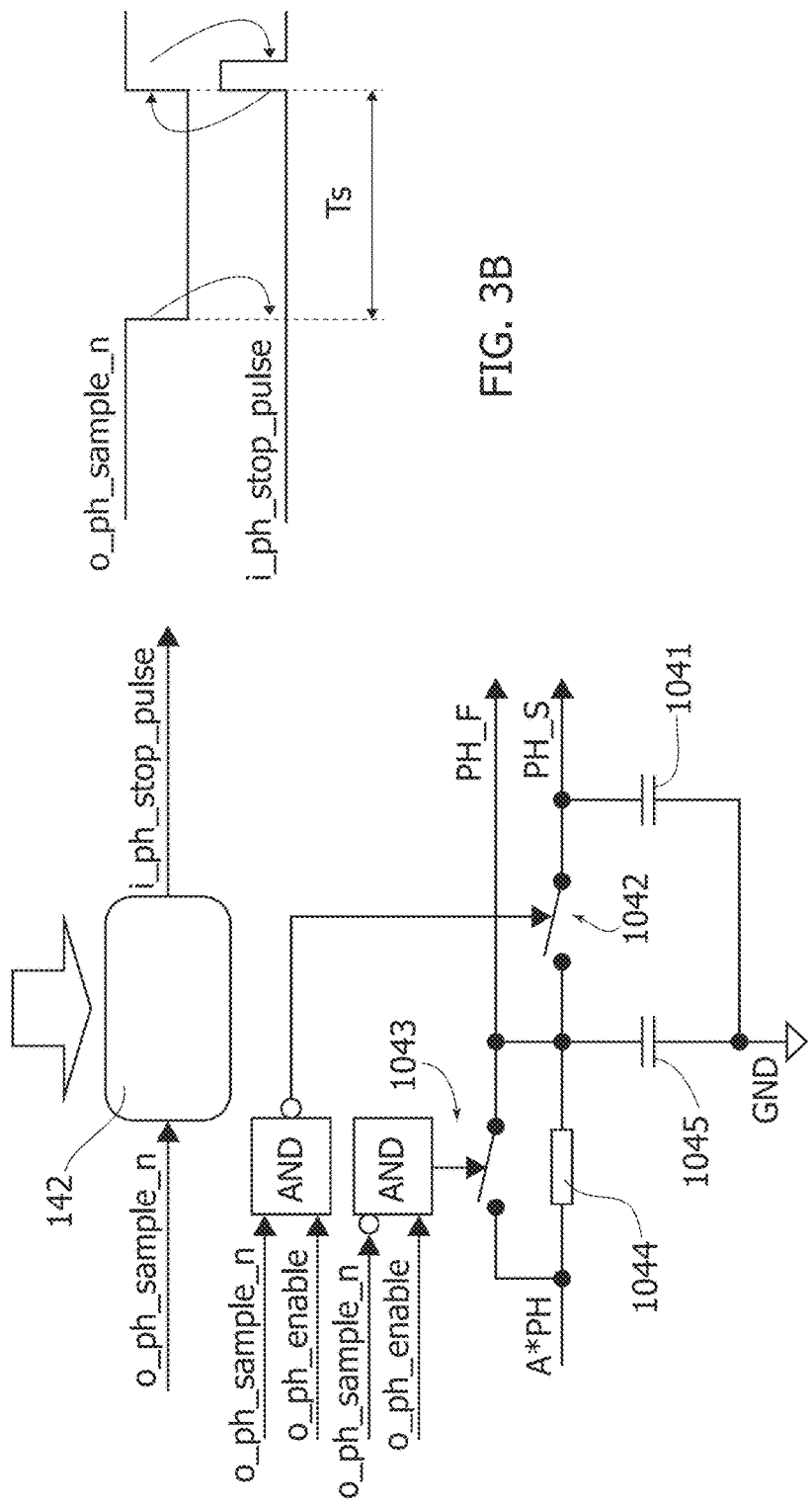
FIG. 3A
FIG. 3B

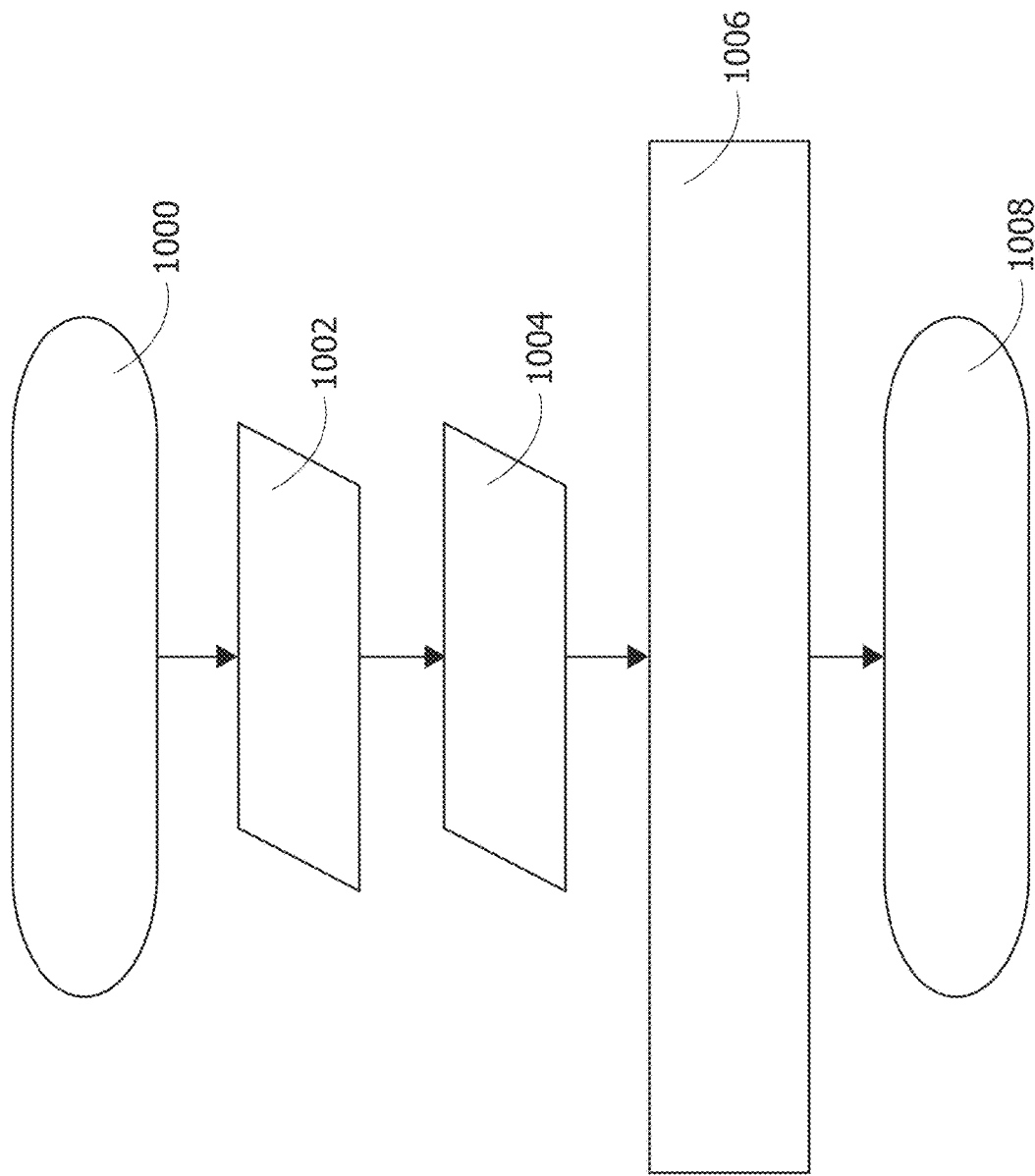

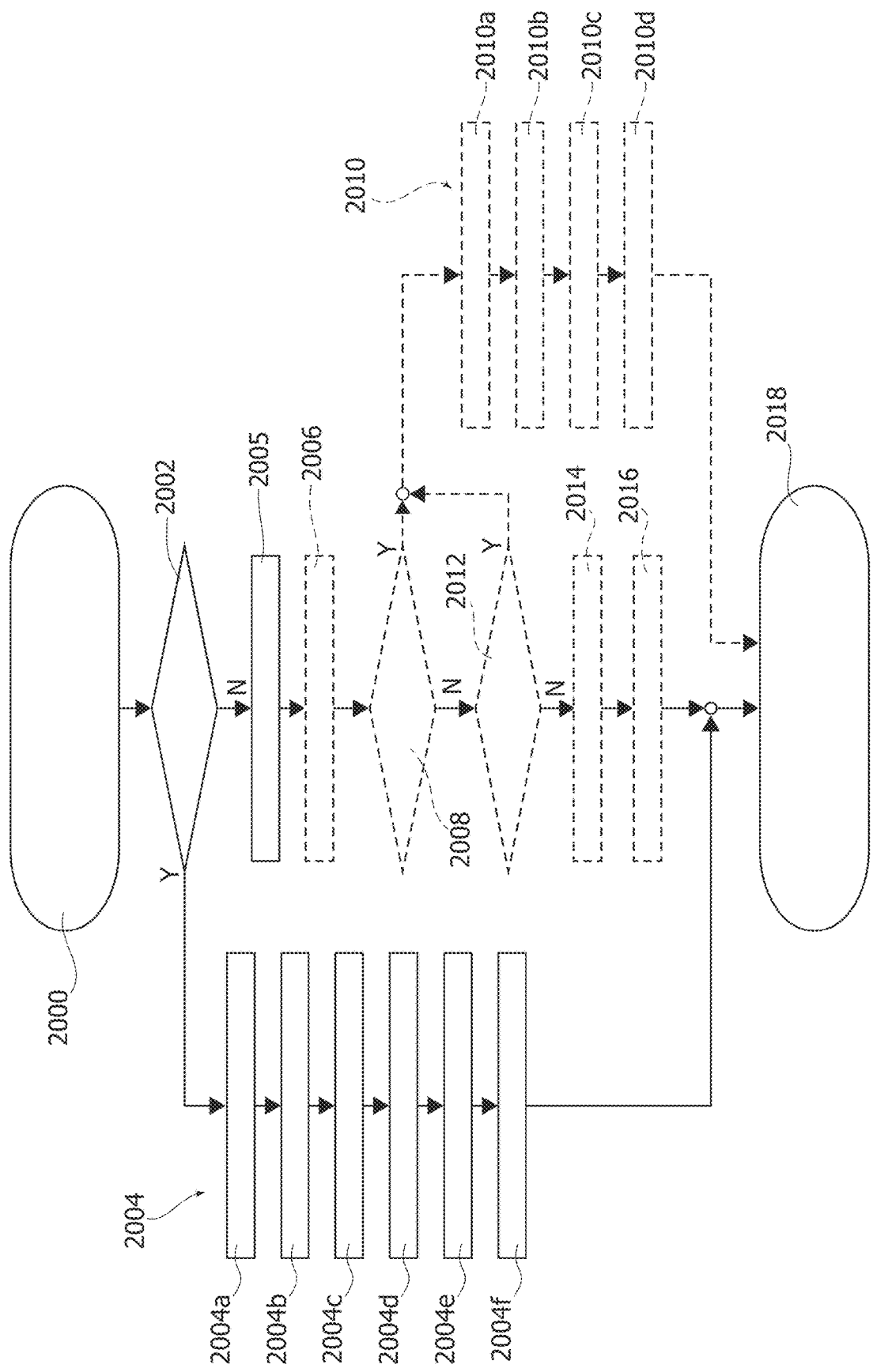

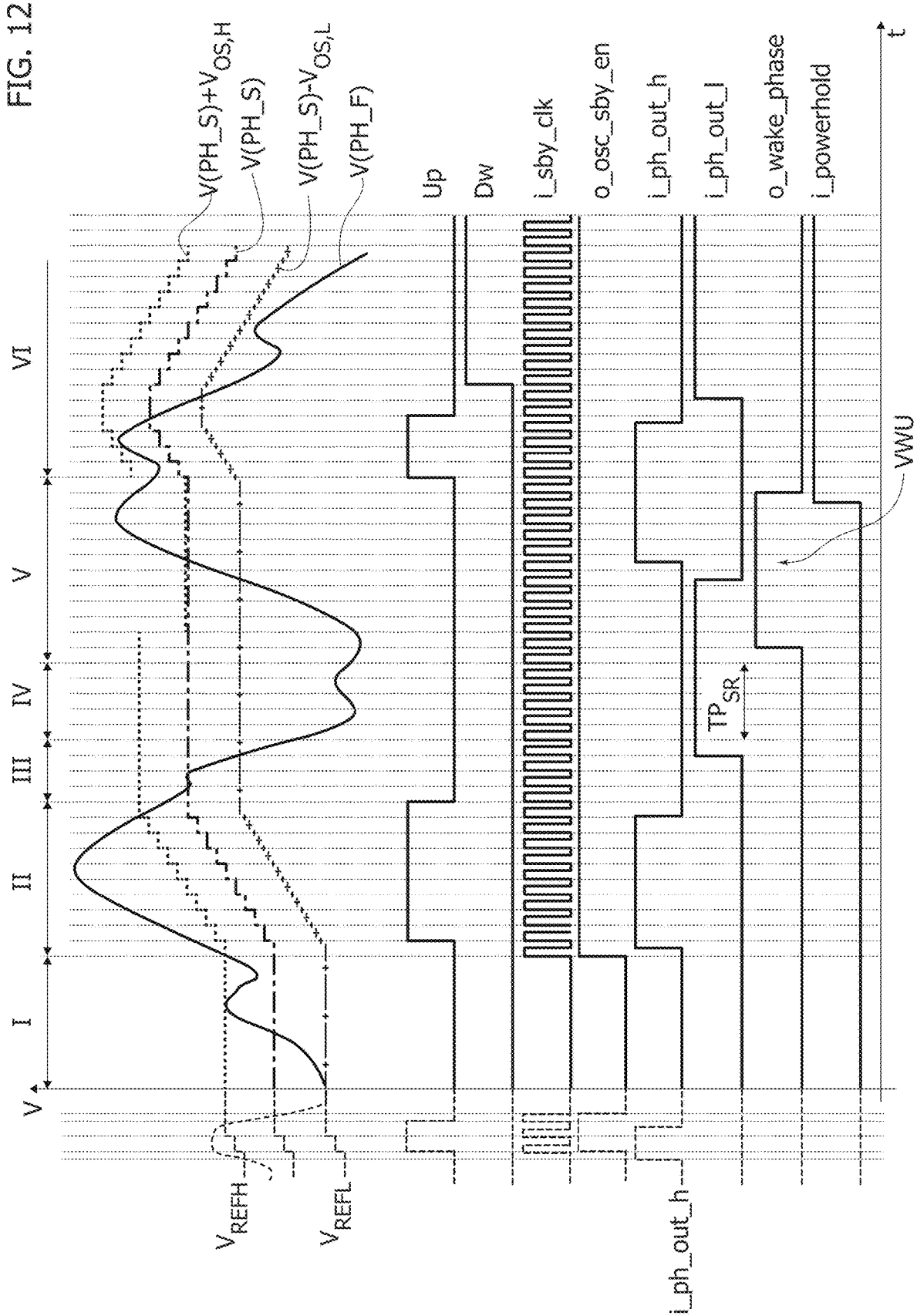

SIGNAL DETECTION METHOD, CORRESPONDING CIRCUIT, DEVICE AND SYSTEM

CROSS-REFERENCE TO RELATED APPLICATIONS

This application claims priority to Italian Patent Application No. 102019000002959, filed on Feb. 28, 2019, which application is hereby incorporated herein by reference.

TECHNICAL FIELD

The present disclosure relates generally to an electronic system and method, and, in particular embodiments, to a signal detection method, corresponding circuit, device, and system.

BACKGROUND

Power generation systems in vehicles comprise various electrical components, both of the static and the moving types, such as: an alternator, an electronic voltage regulator, a diode rectifier bridge, a battery and various loads.

The alternator is in charge of converting mechanical energy into electrical energy. The alternator may be a dynamoelectric machine basically made of a mobile rotor winding and three fixed stator windings.

The power generation process may involve providing an excitation current in a rotor coil which rotates and is surrounded by the three stator windings. These three windings are physically arranged in a way such that, from the electrical point of view, the three windings form a three-phase stator system. That is, each stator coil provides an alternating current and the three alternating currents thus provided are 120° out-of-phase. These "phase" signal currents then enter the rectifier bridge where a rectified current is provided with the aim of facilitating a desired state-of-charge (SOC) of the battery and supplying connected car loads.

The excitation current which flows through the rotor coil is controlled by an alternator voltage regulator or AVR. The AVR can enable (or disable) the excitation current flow by regulating the conduction state of a power device (PD). This device facilitates coupling the rotor coil between the battery terminal (BPLUS, for instance) and the vehicle harness, electrically connected to ground.

For instance, the AVR may force a PD conduction state through a PWM (Pulse Width Modulation) control signal with a fixed frequency FEX and variable duty cycle DCEX. For instance, a 0% duty cycle DCEX may correspond to the power stage being in an off state (that is, the rotor coil is not magnetized) and a 100% duty cycle DCEX may correspond to a rotor coil permanently magnetized (that is, full-field operation).

Connection of the rotor coil may result in the PD stage playing a "high-side" role when the inductive load has a terminal connected to the vehicle harness and a "low-side" role when a terminal load is permanently tied to the battery terminal.

Alternator voltage regulators as used today (in the form of integrated circuits, for instance) in automotive applications should desirably offer (very) low current consumption in stand-by state when the vehicle is in a parking mode. For example, an AVR current specification target may be about <50 µA.

Among other possible mechanisms, a self-start mode is oftentimes available in these regulators to facilitate the AVR in exiting the low-current stand-by state.

SUMMARY

Despite the extensive activity in the area, further improved solutions are desirable.

Some embodiments relate to signal detection.

One or more embodiments may apply to alternator voltage regulators (AVR's) for use in the automotive sector, for instance.

One or more embodiments relate to a signal detection method.

One or more embodiments relate to a corresponding circuit. An alternator voltage regulator may be exemplary of such a circuit.

One or more embodiments relate to a corresponding device. An alternator equipped with a voltage regulator may be exemplary of such a device.

One or more embodiments relate to a corresponding system. A power generation system including an alternator, for use, for instance, in a vehicle may be exemplary of such a system.

One or more embodiments provide a phase wake-up detector architecture adapted for use in a wide variety of applications.

The detailed description of embodiments as provided herein refers by way of example to a phase wake-up detector architecture involving (only) a single phase signal coming from a three-phase stator system.

It will be otherwise appreciated that one or more embodiments can be applied, more generally, to those contexts where a signal intended to produce wake-up of a certain device from a "sleepy" state (for instance a low consumption state) is desired to be recognized by being distinguished over spurious signals such as, for instance, leakage currents in a bridge rectifier.

It will similarly appreciated that an alternator as discussed in the following is just an example of a dynamoelectric machine to which embodiments may apply. One or more embodiments may apply to other types of dynamoelectric machines, such as, for instance, electric motors.

One or more embodiments may provide a phase wake-up detector exhibiting a current consumption level complying with recent low-current consumption specifications for AVR stand-by state. Again, reference to such possible context of use is not to be construed, even indirectly, in a limiting sense of the embodiments.

One or more embodiments provide a phase wake-up detector exhibiting low current consumption by reducing the time a stand-by oscillator is enabled. For instance, the phase signal update task may be carried out without stand-by oscillator turn-on.

One or more embodiments lend themselves to being implemented via circuitry which is robust against both salt and moisture attacks and/or is capable of rejecting undesired effects of leakage currents originated by the diode bridge rectifier. It is noted that both moisture and currents may result in an appreciable DC component appearing along with the AC phase quantity to be detected.

One or more embodiments may provide an asynchronous, event-driven, sub-stage in a phase wake-up analog detector, which can be implemented in various ways. For example, some embodiments implement arrangements where systematic offset voltages from a window voltage comparator sub-stage are moved to a generator based on a sampling capacitor and/or where a digital-to-analog (D2A) converter is used, which may also take into account systematic offset voltages.

One or more embodiments may involve recognizing a valid AC wake-up event and rejecting any invalid similar event (such as false events caused by leakage currents).

One or more embodiments may provide one or more of the following advantages:
- single-phase configuration still applicable;
- semiconductor area saving;
- DC level rejection;
- AC amplitude evaluation without low-frequency oscillator activated;
- low-frequency oscillator turned-on only when time-related verification is desired; and
- low current consumption.

BRIEF DESCRIPTION OF THE DRAWINGS

One or more embodiments will now be described, by way of example only, with reference to the annexed figures, wherein:

FIGS. 3A, 3B, 4A, 4B and 5 are block diagrams exemplary of possible implementations of certain parts of embodiments;

FIGS. 6 to 9 are flow-charts exemplary of possible acts in operation of embodiments;

FIGS. 10, 11 and 12 are exemplary of the time behavior of certain signals which may occur in embodiments.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As noted, one or more embodiments may apply to alternator voltage regulators (AVR's) for use in the automotive sector, for instance.

Figures 13A, 13B:
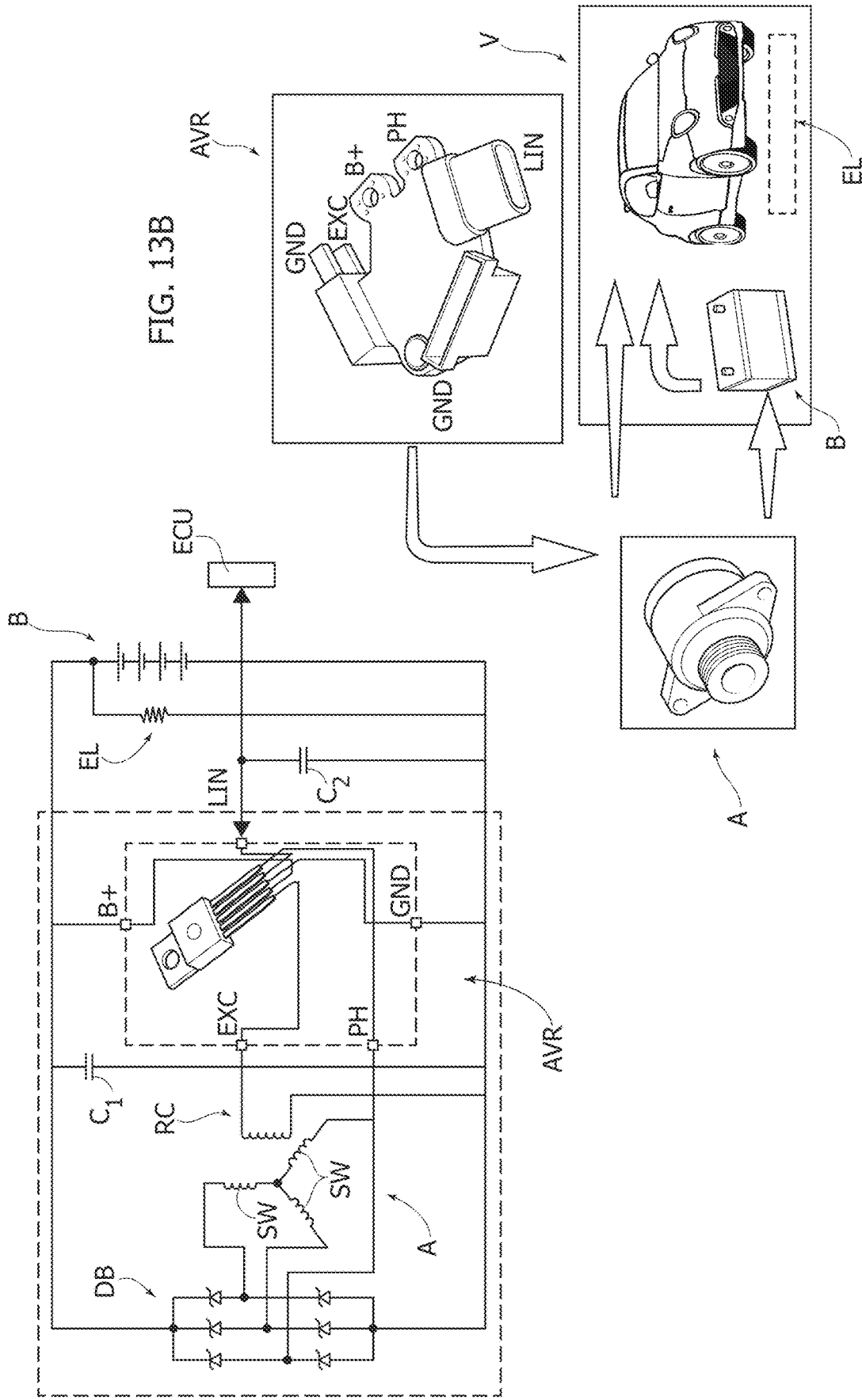
FIGS. 13A and 13B are an electrical diagram and a functional diagram, respectively, exemplary of possible applications of embodiments.

Reference to such possible application and the depiction in FIGS. 13A and 13B are otherwise merely exemplary and are not to be construed, even indirectly, in a limiting sense of embodiments.

As discussed previously, an electrical power generation system in a vehicle V such as a motor-car may include an alternator A (with stator windings SW and a rotor coil RC), an electronic voltage regulator AVR, a diode rectifier bridge DB, a battery B and various (electrical) loads EL, with operation of the system coordinated by an engine control unit ECU.

Other than for what is discussed in detail in the following, the general structure and the basic criteria of operation of such a system are conventional in the art, which makes it unnecessary to provide a more detailed description herein.

It is noted that certain power generation systems as exemplified in FIGS. 13A and 13B can operate adequately (only) when the voltage regulator AVR is running in an active state, that is with the AVR forced out of stand-by state, with a current absorbed larger than a few tenths of mA and an internal FSM (Finite State Machine) in a proper regulation state, where a computed excitation PWM signal is applied, to facilitate a main battery voltage regulation.

Meaningful inputs for this FSM regulation state can be provided via a protocol from the external control unit ECU and an internal rotation speed signal (coming, for instance, from the three-phase stator system of the alternator A).

If no power generation is desired, then the regulator AVR can be driven to a low-current consumption stand-by state. In the stand-by state, the regulator AVR monitors the available sources to detect possible wake-up events (i.e., ECU-driven protocols, key/ignition turn-on engagement, phase signal voltages).

It will again be appreciated that referring to such a possible field of application is merely for exemplary purposes and is not to be construed, even indirectly, in a limiting sense of the embodiments: whatever the prospected context of use considered, some embodiments prevent appreciable current consumption increases in the presence of wake-up sources evaluated invalid.

Turning again for simplicity to the possible use in connection with an AVR, of these wake-up sources, transition from stand-by to active states induced by (valid) phase signal voltages from the three-phase stator system SW of the alternator A is almost always available and is currently referred to as self-start.

Self-start, sometimes referred also as auto-start or emergency start, may play a significant role in facilitating quitting the stand-by state when the so-called AVR primary wake-up sources (ECU-driven protocols and key/ignition turn-on engagements may be exemplary of these) are not be available due to an external system fault (i.e., a fault that occurs outside the alternator assembly at system connector level).

This may be the case, for instance, when starting power generation is desirable to prevent both undesired battery drain during vehicle travel and/or a poor state of charge (SOC) that can jeopardize cranking to home. For that reason, self-start may be categorized as degraded wake-up.

It is noted that exiting the stand-by state may be facilitated thanks to the residual magnetism of the rotor coil RC.

It is similarly noted that a rotation speed signal as conventionally fed into an alternator voltage regulator may not fully exploit the voltages from the three-phase stator system SW of the alternator A insofar as only one or two voltages are generally exploited.

In fact, a single-phase configuration has the advantage of reducing the pin count of the regulator device especially when using a package with a limited number of leads ($<=_5$).

A two-phase configuration may provide a flexible interface for implementing both efficient rectifier bridge diagnostics (when the capability is desired for the regulator to detect the possible presence of one or more diodes in open/short conditions) as well as a robust phase interface based on a differential signal. In that way, the "phase interface" can be rendered largely insensitive to salt and moisture attacks. Additionally, even appreciable leakage currents from the diode bridge rectifier (e.g., units of tenths of mA) are not in a position to put at risk the residual AC phase voltage, which facilitates reliable amplitude and frequency detection even in hostile environments.

An exemplary approach relying on a single-phase configuration is disclosed in U.S. Pat. No. 5,376,876. That document discloses a phase winding detector used to detect alternator rotation in an alternator charging system. The detector receives a single winding phase output signal and utilizes a sampling apparatus to provide a sampled phase output signal. A comparison circuit provides an output by comparing the phase output signal with the sampled phase output signal, whereby a detection of variation in the phase output signal is provided. After initial detection of variation of the phase winding output signal, additional circuitry compares the phase winding signal with a fixed reference threshold. Detection of a phase winding output signal is implemented without use of a substantial DC blocking capacitor and is implemented by monitoring only one input signal terminal.

In brief, conventional approaches as discussed so far may be ascribed to two categories:

a) synchronous, clock-based solutions where a continuous value, discrete-time (that is, sampled) signal is compared with a continuous value, continuous-time input signal to detect amplitude criterion occurrence;

b) asynchronous solutions, not relying on a clock, where a continuous value, continuous-time, (very) low-frequency filtered signal is compared with a continuous-time input signal to detect amplitude criterion occurrence.

The former category (synchronous) is mainly characterized by a stand-by current magnitude that may not comply with a low-current specification in stand-by state, for instance due to a clock oscillator kept permanently active.

The latter category (asynchronous) may give rise to device area issues, for instance due to the usage of a large-area low-frequency RC analog filter.

One or more embodiments may provide a voltage phase wake-up interface for a voltage regulator such as an alternator voltage regulator AVR as discussed previously based on a single phase signal picked-up from a three-phase stator system SW and capable of providing adequate detection of residual magnetism from the alternator A even in the presence of significant leakage currents from the diode bridge DB and/or a moisture attack. As noted, both of these may result in a large DC component superposed onto the AC input signal to be detected.

One or more embodiments as exemplified herein may comprise an analog circuit block and a digital (numerical) circuit block. These will be referred to in the foregoing as a phase wake-up analog detector circuit 10 and phase wake-up digital stage or circuit 12, respectively.

A wake-up analog detector circuit 10 as exemplified herein may interface directly with a one-phase voltage signal PH from a three-phase stator SW in an alternator (see, for instance A in FIG. 13A). Such a phase signal can be applied to a corresponding input terminal PH to a voltage regulator (AVR, in the examples presented herein), W or V being other designations currently adopted in the literature for that input in conventional regulators.

In one or more embodiments as exemplified herein, the wake-up analog detector circuit 10 is in charge of capturing a (residual) magnetism amplitude voltage and comparing it against a target threshold voltage.

In one or more embodiments as exemplified herein, the wake-up digital stage or circuit 12 is in charge of applying digital filter processing as desired (spike rejection filter time, for instance) and executing a control algorithm.

In order to apply such a digital processing, in one or more embodiments as exemplified herein, the wake-up digital stage or circuit 12 may use a low-frequency, low-current stand-by oscillator 14.

Differently from certain conventional approaches as discussed previously, in one or more embodiments as exemplified herein, the stand-by oscillator 14 can be enabled (directly) by the wakeup digital stage 12 as desired.

It is noted that, at least in certain embodiments, the wake-up analog detector circuit 10 may not use the clock signal from the oscillator 14 in order to evaluate signal amplitude. This facilitates achieving a lower stand-by current consumption in the regulator AVR.

Figure 1:
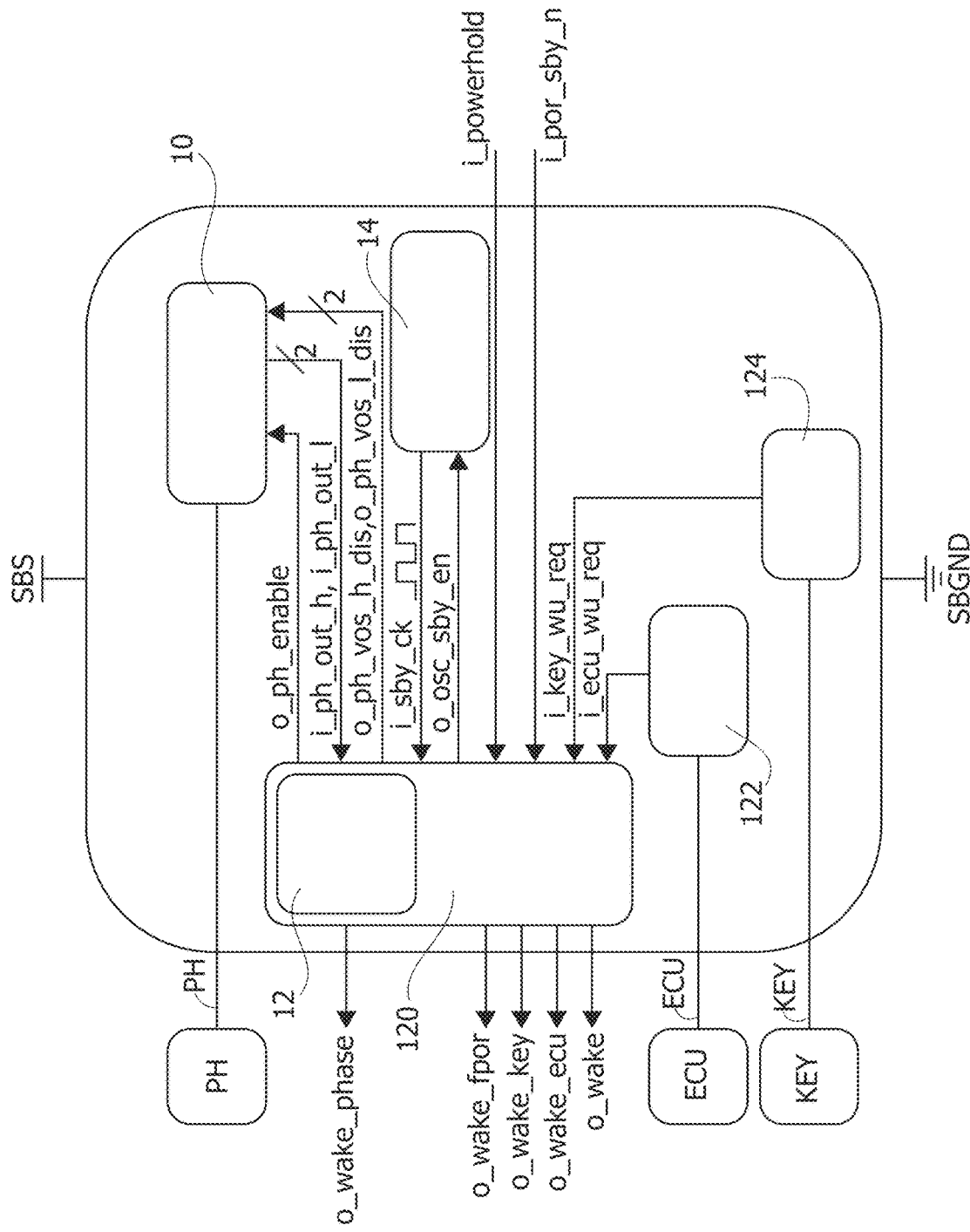
FIG. 1 is a block diagram exemplary of phase wake-up circuitry for use in alternator voltage regulators.

FIG. 1 is an exemplary representation a phase wake-up circuit represented embedded in a AVR stand-by supply domain of the regulator AVR, namely between a stand-by supply voltage at a supply node SBS and a stand-by ground node SBGND.

In addition to the phase signal PH discussed previously, other signals related to phase wake-up circuitry operation as discussed herein may include:

an analog detector enable input, o_ph_enable: if asserted at a first level (high, for instance), then both the PH signal capture function and wake-up analog evaluation are running; if de-asserted at a second level (low, for instance), then the analog wakeup detector 10 does not submit any wake-up event to the phase wake-up digital stage 12 for evaluation;

analog detector outputs, i_ph_out_h, i_ph_out_l: by using these two signals the analog detector 10 may submit analog prequalified wake-up events (i.e., those events that have already passed an analog criterion such as a target threshold voltage reached) to stand-by the digital stage 12 for final timing validation;

systematic offset voltage control inputs, o_ph_vos_h_dis, o_ph_vos_l_dis of the analog detector 10, including a comparator stage (106, in FIG. 2) providing outputs i_ph_out_h, i_ph_out_l which may offer an independent disable function of systematic offset voltages;

a stand-by oscillator clock output, i_sby_ck from the low-frequency, low current stand-by clock;

a stand-by oscillator clock enable input, o_osc_sby_en: if asserted at a first level (high, for instance) then oscillator start-up occurs; if de-asserted at a second level (low, for instance) then the oscillator 14 stops and enters a power-down mode.

a digital stage wake-up-by-phase notification output, o_wake_phase: this may be a flag which is asserted at a first level (high, for instance) when a fully valid phase wake-up event is recognized, fulfilling both amplitude and timing criteria.

Other signals which are related to the stand-by digital stage 120 are exemplified in FIG. 1 for the sake of completeness.

These may include:

a digital stage wake-up notification output, o_wake: this is a main flag which can be asserted at a first level (high, for instance) when either at least one fully valid wake-up event (that is an event finally validated in a stand-by digital stage 120, which may comprise the phase wake-up detector 12) occurs out of phase, key/ignition, ECU, first BPLUS battery engagement (that is an internally-generated wake-up event, related to a o_wake_fpor signal) occurs or an external (i.e., requested by main digital stage) wake request is submitted;

an external power-hold request input, i_powerhold: this is an external, main digital domain wake request submitted by using this digital input;

digital stage wake-up-by-ECU notification output, o_wake_ecu: this flag is asserted at a first level (high, for instance) when a fully valid wake-up event submitted through ECU input is recognized;

digital stage wake-up-by-KEY notification output, o_wake_key: this flag is asserted at a first level (high, for instance) when a fully valid wake-up event submitted through KEY input is recognized;

ECU wake-up detector request output, i_ecu_wu_req: by using this digital signal a ECU wake-up detector 122 may submit to the digital stage 120 a request to fully qualify a wake-up event already precertified according to a defined analog criteria;

KEY wake-up detector request output, i_key_wu_req: by using this digital signal a key wake-up detector 124 may submit to the digital stage 120 a request to fully qualify a wake-up event already pre-certified according to a defined analog criteria;

external power-on reset input, i_por_sby_n: when active low, this external signal may initialize the whole stand-by digital stage 120 after stand-by supply power-up.

It will be otherwise appreciated that, for the sake of simplicity and ease of understanding, other signals which may occur in one or more embodiments as exemplified herein are not visible in the figures. For instance, the outputs from the digital stage 120 (e.g., o_wake_phase) may have associated additional signals (e.g., s_wake_phase) as discussed, e.g., in connection with FIG. 6.

Figure 2:
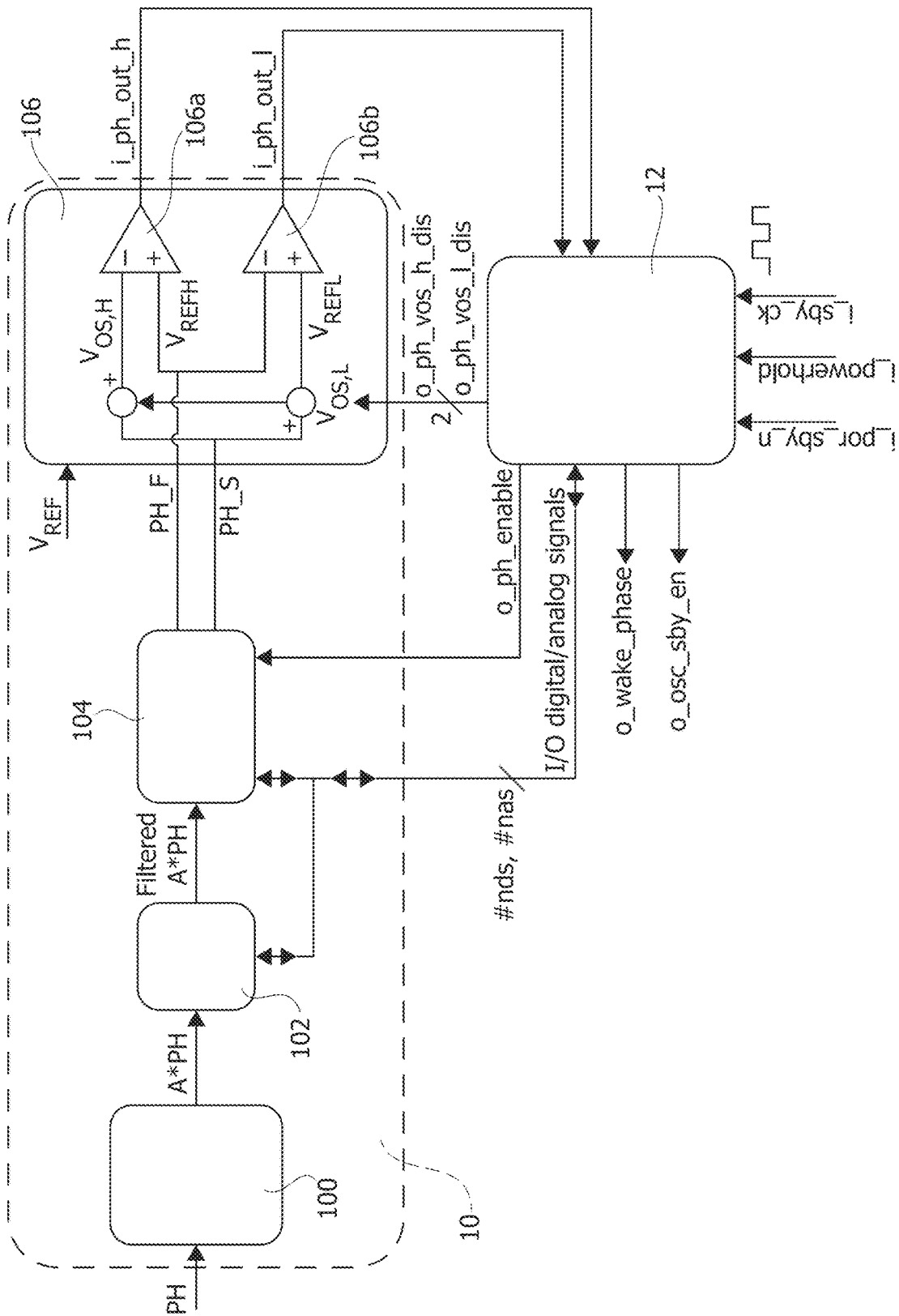
FIG. 2 is a block diagram exemplary of a phase wake-up analog detector.

FIG. 2 exemplifies certain possible architecture details of the phase wake-up analog detector circuit 10.

In one or more embodiments as exemplified herein, the circuit 10 may comprise:

a resistive signal (e.g., voltage) divider 100, having a division (attenuation) factor A<1 and a total input resistance R. The divider 100 facilitates adapting the signal range of the input signal PH to a lowest (minimum) stand-by power supply value;

an electro-magnetic compatibility (EMC) passive analog filter 102, having a dominant pole frequency $f_p$. Analog filter 102, which may act on the output A*PH from the divider 100, facilitates attenuating various nuisance and noise effects above the frequency $f_p$, which may be present at the PH input;

a signal generator 104 configured to receive the signal PH (possibly attenuated at 100, e.g., as A*PH, and filtered at 102) and generate therefrom a pair of signals PH_F/PH_S which may be used in the following sub-stages in order to decide when the (modulus of the) residual magnetism voltage PH exceeds a specified amplitude (voltage) threshold $VP_{StartsTh}$. In some embodiments, circuit 104 may facilitate appreciably operation of embodiments and may be implemented in various forms as exemplified in the following;

a window-type voltage comparator 106 with embedded and controllable systematic offset voltages $VOS,H = (1-o\_ph\_vos\_h\_dis).A.VP_{StartTh}$
$VOS,L = (1-o\_ph\_vos\_l\_dis).A.VP_{StartTh}$ to compare PH_S and PH_F voltage pair.

The comparator 106 as exemplified herein may use a stable reference voltage VREF (generated in a manner known to those of skill in the art).

The phase wake-up digital stage or circuit 12 may facilitate adequate spike rejection times $TP_{SR}$ to filter out undesired spurious glitches affecting window comparator outputs. Also, it may embed a control procedure implemented through a certain number #nds of other I/O digital signals. Some I/O analog signals #nas can be involved as well. In fact, case by case, the cardinality #nds, #nas may depend on the physical implementation for PH_F/PH_S pair signal generator.

The comparator circuit 106 as exemplified herein includes two comparator stages 106a, 106b providing to the digital stage or circuit block 12 "high" and "low" output signals, namely i_ph_out_h and i_ph_out_l. As exemplified herein, these two signals result from comparing the PH_F signal (which is applied to the non-inverting input of the comparator stage 106a and to the inverting input of the comparator stage 106b) with respective thresholds $V_{REFH}$ (applied to the inverting input of the comparator stage 106a) and $V_{REFL}$ (applied to the non-inverting input of the comparator stage 106b).

The thresholds $V_{REFH}$ and $V_{REFL}$ are derived from the signal PH_S by applying thereto the offset voltages $V_{OS,H}$ and $V_{OS,L}$ discussed previously.

The comparator circuit 106 as exemplified herein can be regarded as an "unstructured" window comparator, where—instead of being fused to a single output that goes, e.g., to "1" (only) when the input signal exits the comparator window—the output signals i_ph_out_h and i_ph_out_l are kept separated and used to recognize an increase/decrease in the input signal (here, PH_F).

One or more embodiments may facilitate rejecting DC components of the PH_F signal which might—undesirably—lead to a wake-up event being erroneously declared. An increase of the PH_F signal (only) deriving from leakage current in the diodes in the bridge DB of FIG. 13A may be exemplary of such DC components.

Figure 10:
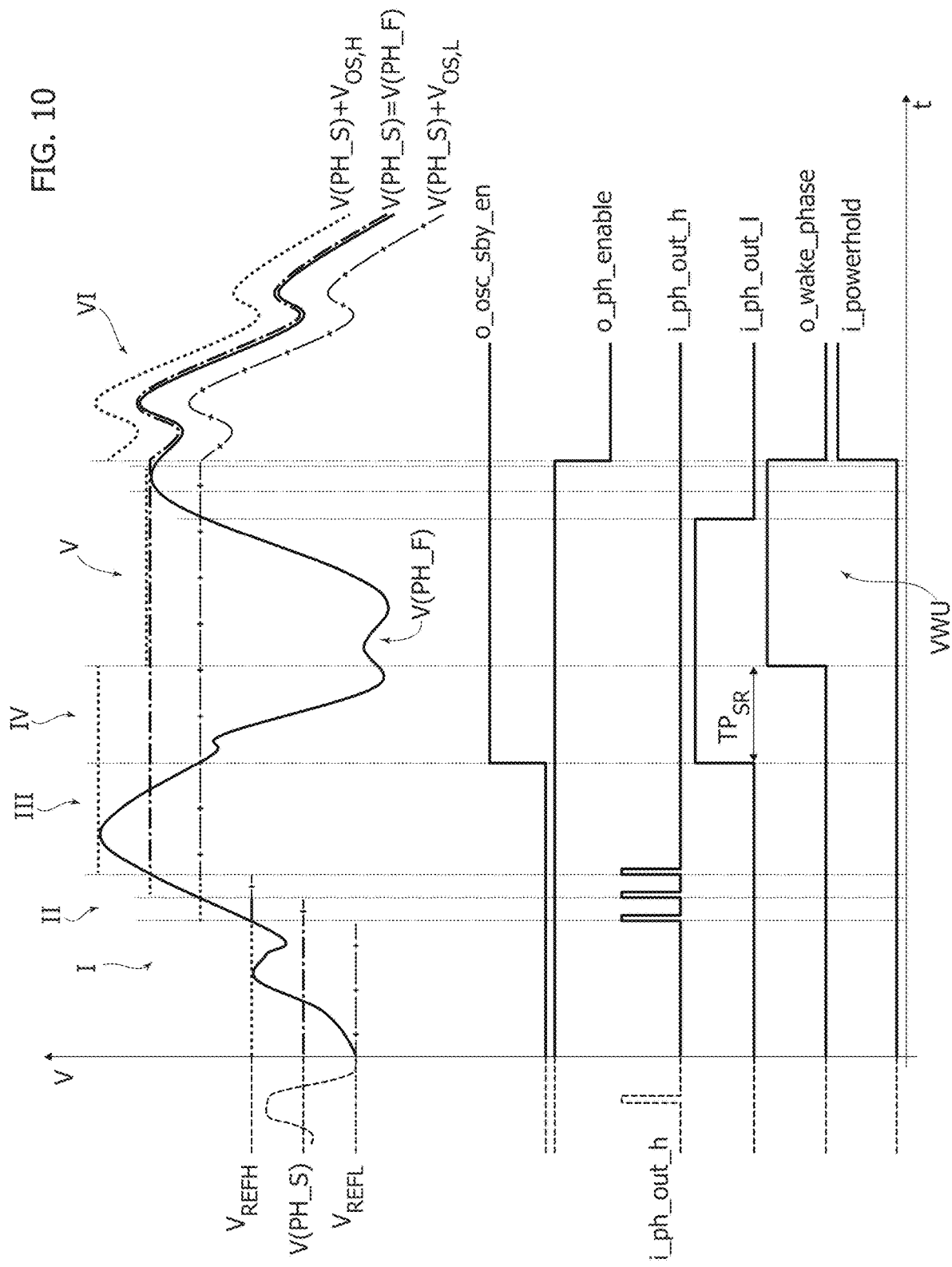

By way of immediate reference, and without wishing to anticipate the discussion which follows, FIG. 10 is exemplary of a possible case where:

an increase in the signal PH_F is rejected three times as an invalid wake-up signal insofar as it does not convey any useful AC signal, and a subsequent decrease in the signal PH_F is then recognized as suited to produce a valid wake-up event as a result of a variation detected to occur between a peak of PH_F and a decrease point thereof which are separated by a amount higher than $VP_{StartTh}$.

One or more embodiments may benefit from the "follower" signal PH_S (obtained, e.g., as discussed in the following) in operating the window comparator 106 with non-fixed, time-variable thresholds depending on PH_S (for instance, thresholds that are dynamically set around PH_S), as discussed in the following.

In one or more embodiments this may facilitate recognizing a certain (e.g., peak-to-peak) variation in PH_F corresponding to a true AC signal, even in the presence of a (slowly varying) DC component in PH_F.

Consequently, one or more embodiments may take advantage from the approaches adopted for generating the signal PH_S.

FIGS. 3A and 3B are exemplary of a first possible, non-mandatory implementation of the PH_S/PH_F pair signal generator of the circuit 104 illustrated in conjunction with the preceding circuit 102 of FIG. 2.

In a simple implementation as exemplified herein, the PH_S/PH_F pair generator 104 may comprise a sampling capacitor 1041 with a capacity Cs and two switches 1042, 1043 (two electronic switches such as MOSFET transistors, for instance) to provide sample-and-hold (S & H) circuitry. For instance, after enabling the analog detector 10, if o_ph_sample_n is asserted at a certain level (low, for instance), then both switches 1042 and 1043 are closed.

Operation of an arrangement as exemplified herein may be controlled via two signals i_ph_stop_pulse, o_ph_sample_n (for instance #nds=2, #nas=0), with i_ph_stop_pulse derived from o_ph_sample_n via an analog timing circuit 142 (with Ts being the sample pulse duration).

In one or more embodiments, the signal PH_F is assumed to correspond to PH (the filtered value A*PH, for instance) while the "follower" signal PH_S is assumed to correspond to a sampled version of A*PH, for instance to A*PH sampled via a sample-and-hold (S & H) action with a period Ts (see the graph on the right-hand side of FIG. 3B).

The switch 1043 is arranged across a resistor 1044 which, together with a capacitor 1045 (with a capacity Cf lower than Cs, for instance) provides an EMC Rf-Cf analog filter. The switch 1043 has the capability of reducing the signal source resistance (that is, the resistance of the voltage source charging the sampling capacitor 1041) by "removing," that is, short-circuiting—the resistor 1044 whose resistance is in the range of, e.g., hundreds of kOhm, when an updated voltage sample is desired to be obtained.

In fact, a source resistance reduction from A*(1−A)*R+Rf down to roughly A*(1−A)*R speeds the charging process of the capacitor 1041. This facilitates sizing the analog sample pulse duration Ts, that is the (analog) time frame where the switches 1042 and 1043 are closed (that is conductive) at a desired lowest (minimum) duration.

When charging Cs to the current value of PH_F voltage (PH_S sample update) is completed, the analog filter 1044, 1045 is restored (i.e., o_ph_sample_n=1). If the analog detector is disabled (i.e., o_ph_enable=0) then no event detection can occur because PH_F=PH_S.

Selecting the value of the capacitance Cs for the sampling capacitor 1041 (much) larger than the capacitance Cf of the capacitor 1045 in the analog filter 1044, 1045 was found to reduce undesired charge sharing effects.

As regards possible criteria for the generation of the signals involved in the sampling action discussed above, the flow charts of FIGS. 6 to 9 apply.

Figure 5:
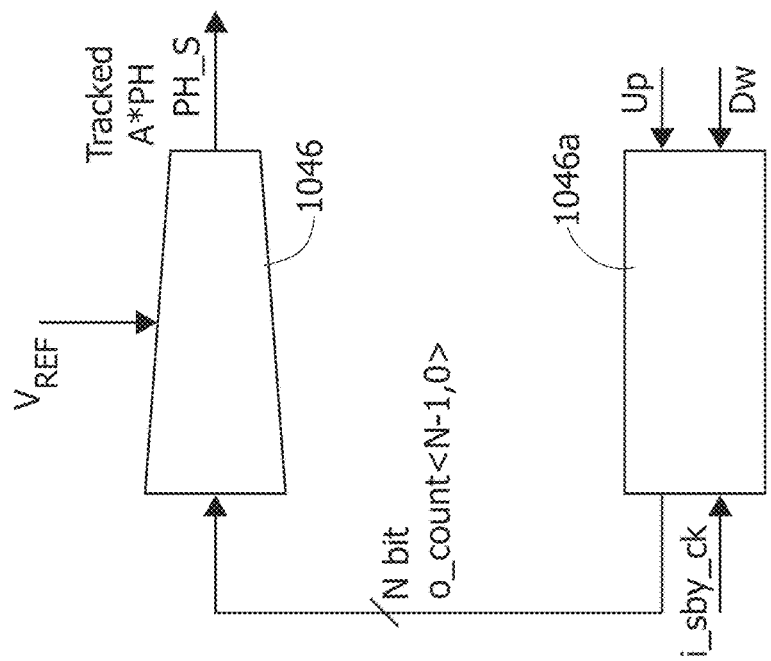
Figure 4A:
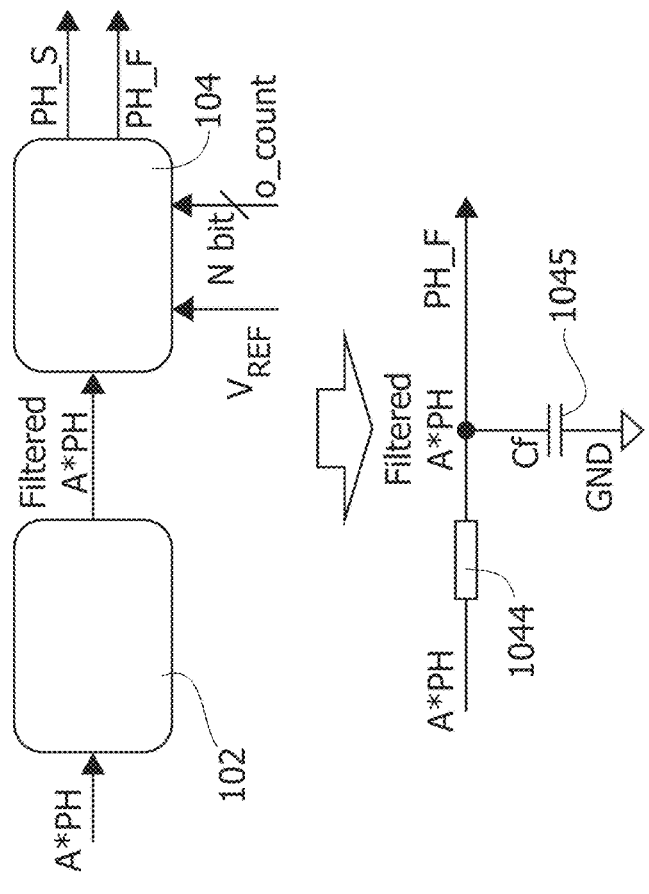
Figure 4B:
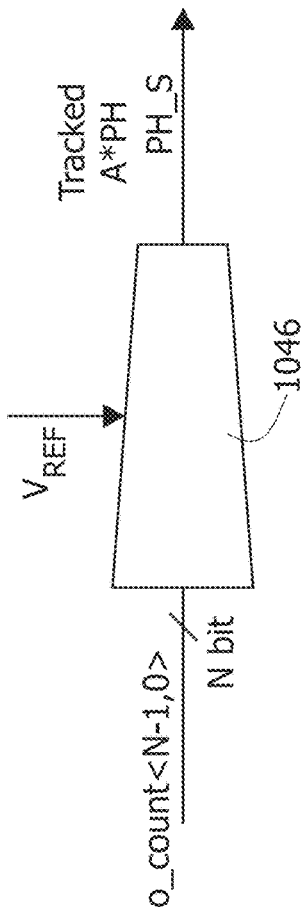

FIGS. 4A, 4B and 5 are exemplary of another possible, non-mandatory implementation of the PH_S/PH_F pair signal generator of the circuit 104 illustrated in conjunction with the preceding circuit 102 of FIG. 2.

The exemplary implementation of FIGS. 4A and 4B involves a digital-to-analog (D2A) data converter 1046 operating, for instance, over N-bits embedded in a closed loop configuration.

The exemplary implementation of FIGS. 4A and 4B involves an additional digital control bus o_count <N−1,0> and a stable reference voltage VREF (i.e., #nds=N, #nas=1) with the o_count bus representing the digital data input for the D2A converter.

In the exemplary implementation presented in FIGS. 4A and 4B, the signal PH_F is again assumed to correspond to the filtered value A*PH, while the "follower" signal PH_S is now assumed to comprise a replica A*PH obtained by a tracking action.

While an RC filter 1044, 1045 may still be present, in the exemplary implementation presented in FIGS. 4A and 4B a switch across the resistor 1044 is no longer used, this being also the case for a switch to force a short circuit between the PH_F and PH_S domains. In the exemplary implementation presented in FIGS. 4A and 4B this switch can be dispensed with because by enabling PH_S tracking with respect to PH_F, as discussed in the following, a detection disable can be obtained in the phase wake-up digital stage 12 so that a o_ph_enable signal is no longer fed into the phase wake-up analog detector 10.

In the exemplary implementation presented in FIGS. 4A and 4B, the tracked A*PH signal can be obtained through a closed-loop architecture of a mixed type (that is, including both analog and digital sub-stages), that implements as a whole a tracking-mode analog-to-digital (A2D) data converter. Such a tracking-mode analog-to-digital data converter may embed an N-bit Up/Down (U/D) counter, which may be arranged in the phase wake-up digital stage 12 and is not explicitly visible in FIGS. 4A and 4B.

This possible mixed nature of the tracking-mode converter 1046 is shown more explicitly in FIG. 5, where the N-bit Up/Down (U/D) counter is indicated as 1046a, with the related signals Up (Up count) and Dw (Down count) can be calculated by the control algorithm (running in the phase wake-up digital stage 12) in such a manner to have the signal PH_S "track" the signal PH_F.

For instance:
if Up=1 and Dw=0, then the counter 1046a may operate a +1 at each clock cycle;
if Up=0 and Dw=1, then the counter 1046a may operate operates a −1 at each clock cycle;
if Up=Dw=0, then the counter 1046a may freeze the previous values.

In one or more embodiments, the scenario Up=Dw=1 is not contemplated.

As regards possible criteria for the generation of the signals involved in the tracking action discussed above, the flow charts of FIGS. 6 to 9 apply.

Operation of one or more embodiments will now be described in the following with explicit reference to a PH_S/PH_F pair signal generator implementation as per FIGS. 3A and 3B. The exemplary description provided herein otherwise also applies mutatis mutandis to an implementation as per FIGS. 4A and 4B (and 5) as well as to other possible implementations which may be devised by those of skill in the art on the basis of the disclosure provided herein.

Briefly, operation of one or more embodiments as exemplified herein may involve a number of main sub-tasks within a procedure. Such a procedure can be implemented by those of skill in the art as a numerical algorithm running in the phase wake-up digital stage 12, which, in one or more embodiments, may be charged with the task of implementing the procedures exemplified in FIGS. 6 to 9.

For instance such sub-tasks may involve:
phase detector disable, e.g., at first power-up of the regulator AVR as a result of power-up connection to a BPLUS terminal of the battery B (see FIGS. 13A and 13B). That task manages the temporary disablement of the phase wakeup detection functionality until AVR initialization, caused by first BPLUS battery power-up, is successfully completed. This goal may be reached by checking the status of a stand-by digital stage internal signal s_wake_fpor (see, for instance, the flow charts of FIGS. 6 and 7);

recognition of a first output active between i_ph_out_h and i_ph_out_l (see, for instance, the flow chart of FIG. 8) which cannot be simultaneously active in window comparator 106. Identification of first output returning activity is stored as s_first_out_h/s_first_out_l signals and can be exploited for launching either one of two subsequent sub-tasks;

PH_S sample update. This task oversees the voltage sampling process at the sampling capacitor 1041 and, if sampling is desired to be launched, it defines the analog-based sample pulse duration Ts by acquiring the i_ph_stop_pulse input and controlling the o_ph_sample_n output. It is noted that such a PH_S sample update process does not involve turning on the stand-by oscillator 14 (see, for instance, the flow chart of FIG. 9);

$TP_{SR}$ test on i_ph_out_h/i_ph_out_l pulse duration. This task involves turning on the oscillator 14 through o_osc_sby_en in order to perform pulse duration measurements, accepting only pulses longer than a duration threshold $TP_{SR}$ and rejecting all pulses which do not comply with the related specification (see again FIG. 9);

systematic offset voltage control. According to all valid pulse sequences acquired and decoded using i_ph_out_h/i_ph_out_l, the task disables/enables systematic offset voltages, independently on the two sides of the window comparator 106a, 106b (see also FIG. 9).

FIGS. 6 to 9 reproduce various flow charts exemplary of possible operation of embodiments.

For the sake of clarity and simplicity of description, these flow-charts refer to the occurrence of one phase wake-up event only with all possible wake-up sources save for phase (signal PH) inactive. This is otherwise a judicious assumption: in fact all other possible AVR wake-up sources, with the notional exception of the one generated by the first battery terminal connection (BPLUS), can be assumed to be inactive.

Also, throughout the flow charts of FIGS. 6 to 9:

the symbols Y and N denote in a conventional manner a positive (Y) or negative (N) outcome of a related check block, whenever applicable, dashed blocks/lines are exemplary of acts/conditions where the stand-by oscillator 14 is on (active).

The blocks in the flow charts of FIGS. 6 to 9 are exemplary of the acts/conditions listed in the following.

FIG. 6

1000—begin PH wake-up detection process: (i_por_sby_n, i_powerhold, s_wake_fpor, i_ph_stop_pulse, i_ph_out_h, i_ph_out_l), 1002—initialization process (i_por_sby_n, i_powerhold, s_wake_fpor), 1004—analog interface control process: (i_ph_stop_pulse, i_ph_out_h, i_ph_out_l), 1006—
o_ph_enable←s_ph_enable,
o_ph_vos_h_dis←s_ph_vos_h_dis,
o_ph_vos_l_dis←s_ph_vos_l_dis,
o_ph_sample_n←s_ph_sample_n,
o_wake_phase←s_wake_phase,
o_osc_sby_en←s_osc_sby_en, 1008—end PH wake-up detection process: (i_por_sby_n, i_powerhold, s_wake_fpor, i_ph_stop_pulse, i_ph_out_h, i_ph_out_l).

FIG. 7

2000—begin initialization process: (i_por_sby_n, i_powerhold, s_wake_fpor),

2002—i_por_sby_n=0?, 2004 (2004a to 2004f—as a result of a positive outcome (Y) of 2002), 2004a—analog detector enabled, 2004b—wake-up-by-phase flag is CLEAR, 2004c—both $V_{OS,H}$ and $V_{OS,L}$ are assigned NOT ZERO, 2004d—sample update enabled, 2004e—stand-by oscillator disabled, 2004f—previous active output is assigned to NONE, 2005 (negative outcome (N) of 2002)—stand-by oscillator enabled, 2006—sample update disabled, 2008—s_wake_fpor=1?, 2010 (2010a to 2010d—positive outcome (Y) of 2008 or positive outcome (Y) of 2012), 2010a—analog detector disabled, 2010b—wake-up-by-phase flag is CLEAR, 2010c—both $V_{OS,H}$ and $V_{OS,L}$ are assigned NOT ZERO, 2010d—previous active output is assigned to NONE, 2012 (negative outcome (N) of 2008)—i_powerhold=1?, 2014 (negative outcome (N) of 2012—positive outcome (Y) of 2012 leads to 2010)—analog detector enabled, 2016—stand-by oscillator disabled, 2018—end initialization process: (i_por_sby_n, i_powerhold, s_wake_fpor).

FIG. 8

3000—begin analog interface control process: (i_ph_stop_pulse, i_ph_out_h, i_ph_out_l), 3002—i_ph_out_h=i_ph_out_l=0?, 3004—(positive outcome (Y) of 3002)—end analog interface control process: (i_ph_stop_pulse), 3006—(negative outcome (N) of 3002)—i_ph_out_h=1?, 3008—(positive outcome (Y) of 3006)—was previous active output i_ph_out_l?, 3010 (positive outcome (Y) of 3008)—$TP_{SR}$ test on i_ph_out_h, 3012 (3012a and 3012b—negative outcome (N) of 3008), 3012a—$V_{OS,L}$ is assigned NOT ZERO, 3012b—previous active output is assigned i_ph_out_h, 3014—sample update, 3016 (negative outcome (N) of 3006)—was previous active output i_ph_out_h?, 3018 (positive outcome (Y) of 3016)—$TP_{SR}$ test on i_ph_out_l, 3020 (3020a and 3020b—negative outcome (N) of 3016), 3020a—$V_{OS,H}$ is assigned NOT ZERO, 3020b—previous active output is assigned i_ph_out_l, 3014—sample update.

FIG. 9

3014—sample update (see also FIG. 8),

4002—is wake-up-by phase flag SET?, 4004 (negative outcome (N) of 4002)—sample update enabled, 4006—i_ph_stop_pulse=i?, 4008 (positive outcome (N) of 4006)—sample update disabled, 3018—$TP_{SR}$ Test On i_out_l, 4000a—stand-by oscillator enabled (coming from 3018), 4010—i_ph_out_l=1 for $TP_{SR}$?, 4012 (positive outcome (Y) of 4010)—$V_{OS,L}$ is assigned ZERO,

4000b—stand-by oscillator enabled (coming from 3010),
4014—i_ph_out_h=1 for $TP_{SR}$?,
4016 (positive outcome (Y) of 4014)—$V_{OS,L}$ is assigned ZERO,
4018 (from either of 4012 or 4016)—wake-up-by-phase flag is SET,
4020 (negative outcome (N) of either of 4010 or 4014)—stand-by oscillator disabled,
4022 (from any of 4018, 4020, 4008, positive outcome (Y) of 4002, negative outcome (N) of 4006)—end analog interface control process: (i_ph_stop_pulse, i_ph_out_h, i_ph_out_l).

It will be otherwise understood that the flow charts of FIGS. 6 to 9 are provided for the sole purpose of enabling those of skill in the art to gain a full, clear and exhaustive understanding of exemplary ways of implementing one or more embodiments. Consequently, the flow charts of FIGS. 6 to 9 are not to be construed, even indirectly, in a limiting sense of embodiments.

FIG. 10 is an exemplary representation of a possible time behavior (plotted against a common abscissa time scale t and with arbitrary ordinate scale V) of various (voltage) signals in the exemplary case the signal PH_S is generated via a sample & hold circuitry as exemplified in FIGS. 3A and 3B, namely:
  the thresholds $V_{REFH}$ and $V_{REFL}$ of the comparator 106 as dynamically varied as a function of a voltage signal V(PH_S) for PH_S;
  a voltage signal V(PH_S) for PH_S (in chain line);
  a voltage signal V(PH_F) for PH_F (in continuous line);
  o_osc_sby_en;
  o_ph_enable;
  i_ph_out_h;
  i_ph_out_l;
  o_wake_phase;
  i_powerhold.

Merely for the sake of explanation it will be assumed that the latest output change in the comparator 106 is i_ph_out_h, as represented in dotted line on the left side (t<0) of FIG. 10.

Assuming that the voltage signal V(PH_F) for PH_F is, for instance, increasing for t>0 the next output that switches will be again i_ph_out_h. The analog interface control process exemplified in FIG. 8 will thus reach the block 3002 and then 3006 because one of the two outputs of the comparator 106 has changed. Exit from 3006 will be towards 3008 and then, due to s_first_out_l=0, s_first_out_h=1 towards 3012, where s_first_out_l=0 and s_first_out_h=1 will be confirmed, and finally towards 3014.

Action at 3014 (sample update) will generate—without the help of the oscillator 14—the sampling (time) window Ts and lead to the updating of the voltage on the capacitor 1041 in FIG. 3B: in fact the sample update.

Figure 9:
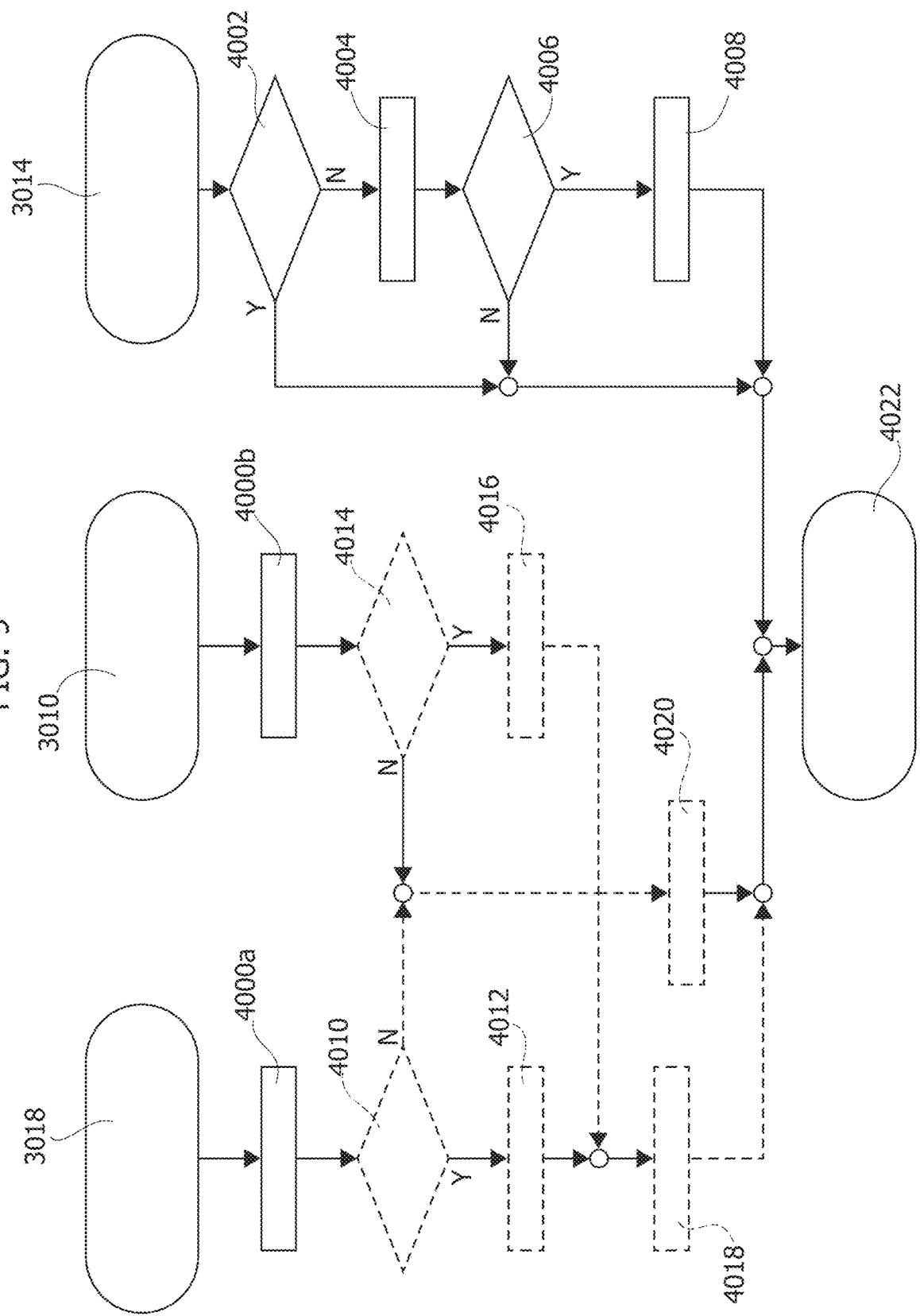

By referring to FIG. 9, act 4002 will follow (still with s_wake_phase=0) and then act 4004, where sampling begins due to last until the section 142 (FIG. 3B) returns i_ph_stop_pulse=1. When exiting at 4008, the sampling window ends and V(PH_S) assumes a new voltage value integrated and stored, equal to the value assumed by PH_F at the (earlier) switching moment of i_ph_out_h.

The thresholds $V_{REFH}$ and $V_{REFL}$, which are "constructed" starting from PH_S correspondingly move (upwards, in the exemplary case considered) and the process is completed at 4022, with no changes, i.a. in the o_wake_phase signal intended to prompt a wake-up event (as a result of switching, e.g., to "1").

The (purely) exemplary representation of FIG. 10 assumes that the signal V(PH_F) for PH_F continues to increase, so that a (second) switching in i_ph_out_h will occur again. The sequence discussed previously will be repeated, with the thresholds $V_{REFH}$ and $V_{REFL}$, moving further upwards (in the exemplary case considered) due to a change in the signal V(PH_S) for PH_S with again no changes in the o_wake_phase signal and no wake-up event prompted.

The representation of FIG. 10 assumes that the signal V(PH_F) for PH_F still continues to increase, so that a (third) switching in i_ph_out_h will occur. The sequence discussed previously will again be repeated, with the thresholds $V_{REFH}$ and $V_{REFL}$, moving still further upwards due to a change in the signal V(PH_S) for PH_S with again no changes in the o_wake_phase signal and no wake-up event prompted.

The foregoing exemplary time behavior for V(PH_F) discussed so far in connection with FIG. 10 may be of the kind associated with the presence of a (slowly varying) DC component in the signal PH_F, which is thus rejected so that an undesired wake-up event may be avoided.

By proceeding from left to right, the case is hypothesized in FIG. 10 that, after the increase causing the third pulse in i_ph_out_h, the signal V(PH_F) for PH_F may undergo a decrease (under the current value for $V_{REFL}$) causing a toggling of the other output i_ph_out_l of the comparator 106.

Figure 8:
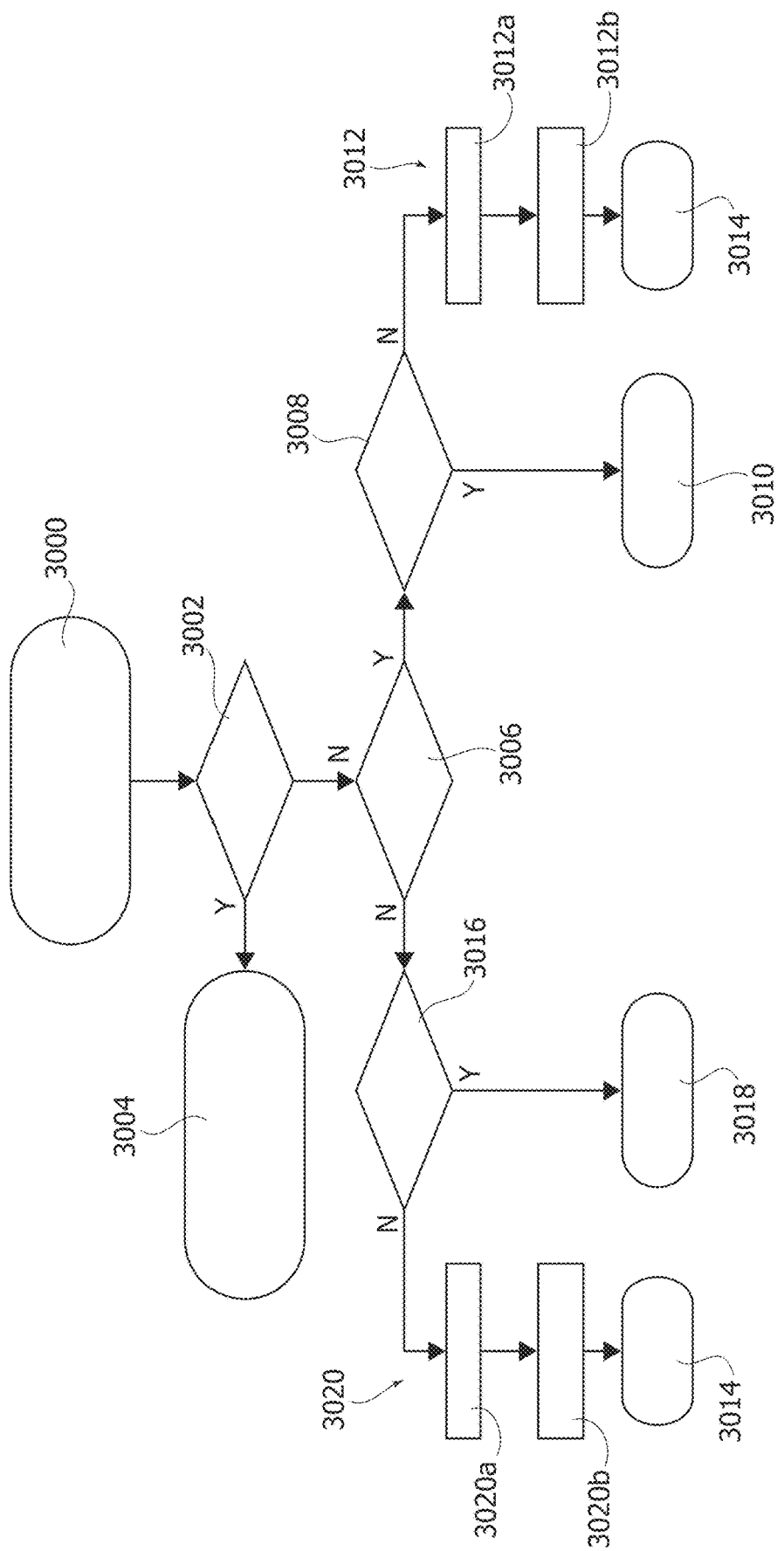

Operation will thus proceed from block 3000 in FIG. 8 on to block 3002 and (this time) to 3016. Since s_first_out_l=0 and s_first_out_h=1 has been previously confirmed (three times) operation will proceed from 3016 to 3018, so that the duration measure of the pulse i_ph_out_l begins, with the oscillator 14 activated at 4000a to proceed then to 4010 and 4012 (assuming a pulse duration in excess of $TP_{SR}$ as shown in FIG. 10) with a wake-up-by-phase recognized as valid at 4014 (see VWU in FIG. 10).

Due to removal of the offset $V_{OS,H}$ at 4012, $V_{REFH}$ will "lie" on the signal V(PH_S) for PH_S.

Also, as represented on the right side of FIG. 10, following a wake-up-by-phase recognized as valid at VWU (and i_powerhold asserted to high), V(PH_S)=V(PH_F) arranged between V(PH_S)−$V_{OS,L}$ and V(PH_S)+$V_{OS,H}$.

In order to facilitate understanding, six subsequent sections are identified as I to VI in the upper portion of FIG. 10, namely:
  I—stand-by;
  II—sample update;
  III—stand-by (after sample update),
  IV—$TP_{SP}$, measure;
  V—valid wake-up-by-phase recognition (see also VWU in the o_wake_phase signal);
  VI—(AVR) active.

Figure 11:
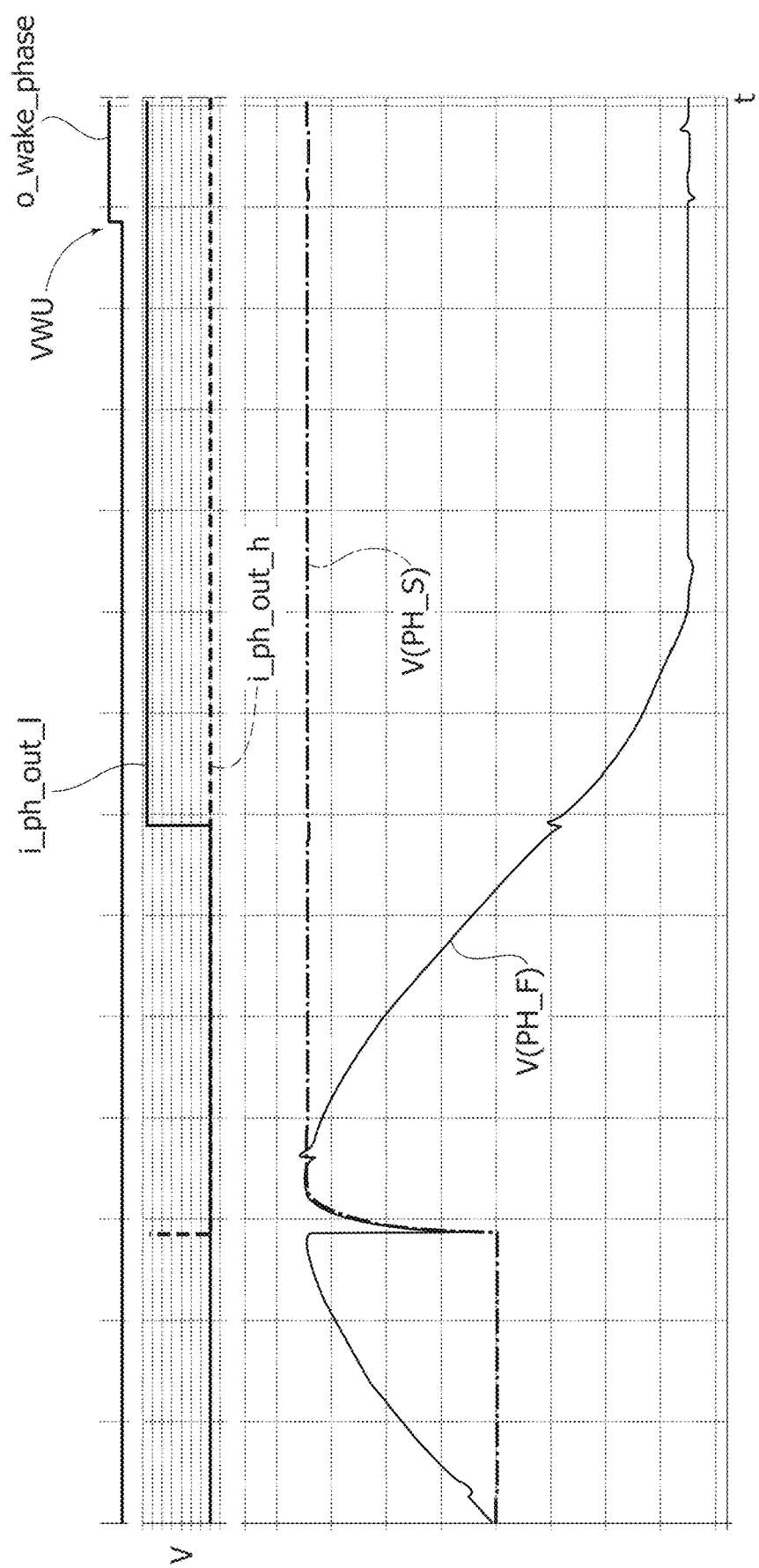

By way of further representation, FIG. 11 is an instrumental reproduction of a possible time behavior, again plotted against a common abscissa time scale t and with arbitrary ordinate scale (voltage V) of time behaviors preceding and around a wake-up-by-phase being recognized as valid at VWU for the following signals (from top to bottom):
  o_wake_phase;
  i_ph_out_l;
  i_ph_out_h;
  V(PH_S);
  V(PH_F).

FIG. 12 is an exemplary representation of a possible time behavior, plotted against a common abscissa time scale t and with arbitrary ordinate scale (voltage V) of various (voltage)

signals in the exemplary case the signal PH_S is generated via a digital-to-analog tracking arrangement as exemplified in FIGS. 4A, 4B and 5, namely:

the thresholds $V_{REFH}$ and $V_{REFL}$ of the comparator 106 as dynamically varied as a function of a voltage signal V(PH_S) for PH_S;

a voltage signal V(PH_S) for PH_S (in chain line);

a voltage signal V(PH_F) for PH_F (in continuous line);

Up and down (Dw) counting signals for the counter 1046a, i_sby_clk, o_osc_sby_en, i_ph_out_h, i_ph_out_l, o_wake_phase, i_powerhold.

Unless otherwise indicated, in FIG. 12 entities like entities already discussed in connection with FIG. 10 are indicated by like references/symbols and a corresponding description will not be repeated for brevity. Again, merely for the sake of explanation it will be assumed that the latest output change in the comparator 106 is i_ph_out_h, as represented in dotted line on the left side (t<0) of FIG. 12.

In order to facilitate understanding, six subsequent sections are identified as I to VI in the upper portion of FIG. 12, namely:

I—stand-by;

II—track update;

III—stand-by (after track update);

IV—$TP_{SR}$ measure;

V—valid wake-up-by-phase recognition (see also VWU in the o_wake_phase signal);

VI—(AVR) active.

In operation as exemplified in FIG. 12, a track update action replaces the sample update action discussed throughout FIGS. 6 to 11.

As noted, such a sample update action may not require activating the oscillator 14, while a track update action as exemplified may involve activation of such an oscillator.

In operation as exemplified in connection with FIGS. 6 to 11, when the wake-up detection task has been completed (with a "true" wake-up event identified) the wake-up detection circuit may be brought to a permanent sensing mode of the PH_F signal (see, for instance, the active portion VI) on the right hand side of FIG. 10).

These latter circumstances may be regarded as corresponding to operation of the circuit of FIG. 3B with an infinite value for Ts (Ts←∞). That is, with the switch 1042 in a same state irrespective of whether o_ph_sample_n=0 or o_ph_enable=0.

Conversely, in operation as exemplified in connection with FIG. 12, when the wake-up detection task has been completed (with a "true" wake-up event identified) the wake-up detection circuit may be kept in a permanent tracking mode of the PH_F signal, with the oscillator 14 possibly on (activated). The additional consumption contribution from the oscillator will be generally acceptable insofar as the device will expectedly have a consumption (well) beyond the stand-by current.

The oscillator may be otherwise kept de-activated (off) in stand-by (portion I in FIG. 12) to avoid increasing consumption. As noted, the oscillator may be otherwise activated (turned on) to implement the track update action (portion ii in FIG. 12).

It will be otherwise appreciated that in FIG. 12 a deliberately "slow" clock has been represented in order to facilitate understanding device operation: in reality, a (much) faster clock may be used.

A method as exemplified herein may comprise:

sensing a signal (see, for instance, PH, A*PH, PH_F, these being different versions of a same signal: as received at the input node PH, as possibly attenuated/divided at 100 and/or filtered at 102, or as further conditioned at 1043 in FIG. 3B or at 1045 in FIG. 4B) indicative of magnetization of a winding (for instance, SW) in a dynamoelectric machine (for instance, an alternator such as A), applying the signal sensed (for instance, PH_F) to a window comparator (for instance, 106) having a comparator window between upper (for instance, $V_{REPH}$) and lower (for instance, $V_{REFL}$) thresholds and generating window exit signals (for instance, i_ph_out_h, i_ph_out_l) indicative of the signal sensed exiting the comparator window of the window comparator, wherein the method comprises:

generating (for instance, in block 104) a slowed-down replica signal (for instance, PH_S) of the signal sensed, updating at discrete times (see, for instance, the sample update or track update actions of portions II in FIGS. 10 and 12) the comparator window of the window comparator as a function of said slowed-down replica signal (see, for instance, the left-hand side of FIG. 10, and issuing a wake-up signal (for instance, o_wake_phase) towards a control device (for instance, a regulator such as AVR) of the dynamoelectric machine as a result of one of said window exit signals indicating (see, for instance, blocks 4010, 4014 in FIG. 9) the signal sensed exiting the comparator window of the window comparator for a time duration in excess of a duration threshold (see, for instance $TP_{SR}$, in FIGS. 10 and 12).

As exemplified herein, updating the comparator window of the window comparator as a function of the replica signal (for instance by moving the window upwards as PH_F—and thus PH_S—increase and moving the window downwards as PH_F—and thus PH_S—decrease), with the replica signal PH_S being a slowed-down replica of PH_F (e.g., as a result of being generated via either a sample and hold processing of PH_F or a digital-to-analog tracking of PH_F) will make it possible for the upper and lower thresholds $V_{REPH}$ and $V_{REFL}$ thresholds of the window comparator (for instance 106) to be updated and "follow" (upwards or downwards) variations in the PH_F signal as possibly due (only) to DC components, such as leakage currents in the diode bridge DB of FIG. 13A).

Conversely, being updated as a functions of a slowed-down (that is, retarded or delayed, for instance due to S & H or D2A tracking) replica of PH_F, the upper and lower thresholds $V_{REPH}$ and $V_{REFL}$ thresholds of the window comparator may be unable to follow "fast" variations (upwards and downwards) in the PH_F signal corresponding to a valid wake-up-by-phase event to be recognized.

The "follower" signal PH_S is designated a slowed-down (or slow-motion) replica of PH_F insofar as PH_S is a replica of PH_F which appears to be moving more slowly (that is, in a retarded or delayed manner with respect to PH_F.

A method as exemplified herein may comprise generating the slowed-down replica signal (for instance, PH_S) by sampling (see, for instance, 1041 to 1045 in FIGS. 3A and 3B) at discrete times (for instance, Ts, o_ph_sample_n, o_ph_enable) the signal sensed.

A method as exemplified herein may comprise generating the slowed-down replica signal (for instance, PH_S) by digital-to-analog tracking (see, for instance, 1044, 1045, 1046, 1046a in FIGS. 4A, 4B and 5) the signal sensed (A*PH).

A method as exemplified herein may comprise generating (for instance, at 104) the replica signal from an amplitude divided (for instance, at 100) and/or low-pass filtered (for instance, at 102) version (see, for instance A*PH) of the phase signal (PH).

A circuit as exemplified herein may comprise:
input circuitry having an input node (for instance, PH) configured to be coupled to a winding (for instance, SW) in a dynamoelectric machine (for instance an alternator A), the input circuitry configured to sense a signal indicative of magnetization of said winding in a dynamoelectric machine,
a window comparator sensitive to the signal sensed, the comparator having a comparator window between upper and lower thresholds and configured to generate window exit signals indicative of the signal sensed exiting the comparator window of the window comparator, wherein the comparator window is adjustable as a function of an update signal (for instance, PH_S),
a signal generator circuit (for instance, 104, possibly integrated to the input circuitry) configured to generate a slowed-down replica signal of the signal sensed, the signal generator circuit coupled to the window comparator and configured to update the comparator window ($V_{REFH}$, $V_{REFL}$) of the window comparator (106) as a function of said replica signal (PH_S), and
processing circuitry (for instance, 12) sensitive to the window exit signals of the window comparator, the processing circuitry configured to issue a wake-up signal applicable to a control device (for instance, a voltage regulator such as AVR) of the dynamoelectric machine as a result of one of said window exit signals indicating the signal sensed exiting the comparator window of the window comparator for a time duration in excess of a duration threshold.

A circuit as exemplified herein may comprise sampling circuitry activatable to sample the signal sensed (for instance, A*PH) and generate therefrom the slowed-down replica signal.

A circuit as exemplified herein may comprise digital-to-analog tracking circuitry comprising a time-clocked (for instance, i_sby_ck) up-down counter (for instance, 1046a) configured to track the signal sensed (for instance, A*PH) and generate therefrom the slowed-down replica signal.

In a circuit as exemplified herein the input circuitry may comprises an amplitude divider (100) and/or a low-pass filter (102) arranged between the input node (PH) the signal generator circuit block (104).

In a circuit as exemplified herein an oscillator circuit (for instance 14) may be provided selectively activatable (for instance, at 4000a or 4000b) to evaluate the time duration of said window exit signals indicating the signal sensed exiting the comparator window of the window comparator.

In a circuit as exemplified herein, the window comparator may comprise offset voltage control inputs configured to receive offset voltage control signals (for instance, o_ph_vos_h_dis, o_ph_vos_l_dis), wherein the upper and lower thresholds of the comparator window of the window comparator are adjustable as a function of said offset voltage control signals and a threshold value (for instance, $VP_{StartsTh}$) for magnetization of the winding in a dynamoelectric machine.

A device as exemplified herein may comprise:
a dynamoelectric machine including a winding susceptible to exhibit magnetization,
a circuit as exemplified herein having said input node (for instance PH) coupled to the winding.

In a device as exemplified herein:
the dynamoelectric machine may comprise an alternator (for instance, A, DB) having a stator winding set (for instance, SW) and a rotor coil (for instance, RC),
an alternator voltage regulator (for instance, AVR) may be provided coupled to the rotor coil (for instance, RC) of the alternator to provide voltage regulation at the rotor coil of the alternator,
the circuit may have the input node coupled to one stator winding in the stator winding set of the alternator to sense a phase signal at the stator winding and be configured to issue the wake-up signal towards the alternator voltage regulator.

An electrical energy generation system as exemplified herein may comprise:
at least one electrical load (for instance, EL, B),
a device as exemplified herein coupled to the at least one electrical load to supply electrical energy thereto.

Without prejudice to the underlying principles, the details and embodiments may vary, even significantly, with respect to what has been described by way of example only, without departing from the extent of protection.

The extent of protection is determined by the annexed claims.

What is claimed is:

1. A method comprising:
sensing a first signal indicative of magnetization of a winding in a dynamoelectric machine;
applying the first signal to a window comparator having a comparator window between upper and lower thresholds and generating window exit signals indicative of the first signal exiting the comparator window of the window comparator;
generating a slowed-down replica signal of the first signal;
updating the comparator window of the window comparator as a function of the slowed-down replica signal; and
issuing a wake-up signal towards a control device of the dynamoelectric machine as a result of one of the window exit signals indicating the first signal exiting the comparator window of the window comparator for a time duration in excess of a duration threshold, wherein the window comparator comprises offset voltage control inputs for receiving offset voltage control signals, wherein the upper and lower thresholds of the comparator window of the window comparator are adjustable as a function of the offset voltage control signals and a threshold value for magnetization of the winding in the dynamoelectric machine.

2. The method of claim 1, wherein generating the slowed-down replica signal comprises generating the slowed-down replica signal by sampling at discrete times the first signal.

3. The method of claim 1, wherein generating the slowed-down replica signal comprises generating the slowed-down replica signal by digital-to-analog tracking the first signal.

4. The method of claim 1, wherein generating the slowed-down replica signal comprises generating the slowed-down replica signal from an amplitude divided or low-pass filtered version of the first signal.

5. The method of claim 4, wherein generating the slowed-down replica signal comprises generating the slowed-down replica signal from the amplitude divided and low-pass filtered version of the first signal.

6. A circuit comprising:
an input circuit having an input node configured to be coupled to a winding in a dynamoelectric machine, the input circuit configured to sense a first signal indicative of magnetization of the winding in the dynamoelectric machine;
a window comparator sensitive to the first signal, the window comparator having a comparator window between upper and lower thresholds and configured to generate window exit signals indicative of the first signal exiting the comparator window of the window comparator, wherein the comparator window is configured to be adjustable as a function of an update signal;
a signal generator circuit configured to generate a slowed-down replica signal of the first signal, the signal generator circuit coupled to the window comparator and configured to update the comparator window of the window comparator with the update signal as a function of the slowed-down replica signal; and
a processing circuit sensitive to the window exit signals of the window comparator, the processing circuit configured to issue a wake-up signal applicable to a control device of the dynamoelectric machine as a result of one of the window exit signals indicating the first signal exiting the comparator window of the window comparator for a time duration in excess of a duration threshold, wherein the window comparator comprises offset voltage control inputs configured to receive offset voltage control signals, wherein the upper and lower thresholds of the comparator window of the window comparator are configured to be adjustable as a function of the offset voltage control signals and a threshold value for magnetization of the winding in the dynamoelectric machine.

7. The circuit of claim 6, wherein the signal generator circuit comprises a sample circuit configured to be activatable at discrete times to sample the first signal and to generate the slowed-down replica signal based on the sampled first signal.

8. The circuit of claim 6, wherein the signal generator circuit comprises a digital-to-analog tracking circuit comprising a time-clocked up-down counter configured to track the first signal and to generate the slowed-down replica signal based on an output of the time-clocked up-down counter.

9. The circuit of claim 6, wherein the input circuit comprises an amplitude divider or a low-pass filter coupled between the input node and the signal generator circuit.

10. The circuit of claim 9, wherein the input circuit comprises the amplitude divider coupled to the input node, and the low-pass filter coupled between the amplitude divider and the signal generator circuit.

11. The circuit of claim 6, further comprising an oscillator circuit configured to be selectively activatable to evaluate a time duration of the window exit signals indicating the first signal exiting the comparator window of the window comparator.

12. The circuit of claim 11, wherein the processing circuit is configured to activate the oscillator circuit when the first signal exits the comparator window of the window comparator.

13. A device comprising:
a dynamoelectric machine comprising a winding susceptible to exhibit magnetization; and
a wake-up circuit comprising:
an input terminal coupled to the winding,
an input circuit coupled to the input terminal and configured to sense a first signal indicative of magnetization of the winding,
a window comparator sensitive to the first signal, the window comparator having a comparator window between upper and lower thresholds and configured to generate window exit signals indicative of the first signal exiting the comparator window of the window comparator, wherein the comparator window is configured to be adjustable as a function of an update signal,
a signal generator circuit configured to generate a slowed-down replica signal of the first signal, the signal generator circuit coupled to the window comparator and configured to update the comparator window of the window comparator with the update signal as a function of the slowed-down replica signal, and
a processing circuit sensitive to the window exit signals of the window comparator, the processing circuit configured to issue a wake-up signal applicable to a control device of the dynamoelectric machine as a result of one of the window exit signals indicating the first signal exiting the comparator window of the window comparator for a time duration in excess of a duration threshold, wherein the window comparator comprises offset voltage control inputs configured to receive offset voltage control signals, wherein the upper and lower thresholds of the comparator window of the window comparator are configured to be adjustable as a function of the offset voltage control signals and a threshold value for magnetization of the winding in the dynamoelectric machine.

14. The device of claim 13, wherein the dynamoelectric machine comprises an alternator having a stator winding set and a rotor coil, and wherein the control device comprises an alternator voltage regulator coupled to the rotor coil of the alternator and is configured to provide voltage regulation at the rotor coil of the alternator.

15. The device of claim 14, wherein the input terminal is coupled to a stator winding in the stator winding set of the alternator, and wherein the wake-up circuit is configured to sense the first signal at the stator winding and issue the wake-up signal towards the alternator voltage regulator.

16. The device of claim 13, wherein the signal generator circuit comprises a sample circuit configured to be activatable at discrete times to sample the first signal and to generate the slowed-down replica signal based on the sampled first signal.

17. The device of claim 13, wherein the signal generator circuit comprises a digital-to-analog tracking circuit comprising a time-clocked up-down counter configured to track the first signal and to generate the slowed-down replica signal based on an output of the time-clocked up-down counter.

18. The device of claim 13, wherein the wake-up circuit further comprises an oscillator circuit configured to be selectively activatable to evaluate a time duration of the window exit signals indicating the first signal exiting the comparator window of the window comparator.

19. An electrical energy generation system comprising:
an electrical load; and a device coupled to the electrical load and configured to supply electrical energy to the electrical load, the device comprising:
  a dynamoelectric machine comprising a winding susceptible to exhibit magnetization, and
  a wake-up circuit comprising:
    an input terminal coupled to the winding,
    an input circuit coupled to the input terminal and configured to sense a first signal indicative of magnetization of the winding,
    a window comparator sensitive to the first signal, the window comparator having a comparator window between upper and lower thresholds and configured to generate window exit signals indicative of the first signal exiting the comparator window of the window comparator, wherein the comparator window is configured to be adjustable as a function of an update signal,
    a signal generator circuit configured to generate a slowed-down replica signal of the first signal, the signal generator circuit coupled to the window comparator and configured to update the comparator window of the window comparator with the update signal as a function of the slowed-down replica signal, and
    a processing circuit sensitive to the window exit signals of the window comparator, the processing circuit configured to issue a wake-up signal applicable to a control device of the dynamoelectric machine as a result of one of the window exit signals indicating the first signal exiting the comparator window of the window comparator for a time duration in excess of a duration threshold, wherein the window comparator comprises offset voltage control inputs configured to receive offset voltage control signals, wherein the upper and lower thresholds of the comparator window of the window comparator are configured to be adjustable as a function of the offset voltage control signals and a threshold value for magnetization of the winding in the dynamoelectric machine.

20. The electrical energy generation system of claim 19, wherein the electrical load comprises a battery of a vehicle.

* * * * *